United States Patent
Rapisarda et al.

(10) Patent No.: US 9,076,918 B2
(45) Date of Patent: Jul. 7, 2015

(54) SELECTIVE CHEMICAL ETCHING PROCESS

(75) Inventors: Dario Rapisarda, Villard Bonnot (FR); Joël Dufourcq, Puyoo (FR); Simon Perraud, Bandol (FR); Olivier Poncelet, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 120 days.

(21) Appl. No.: 14/002,261

(22) PCT Filed: Mar. 1, 2012

(86) PCT No.: PCT/IB2012/050975
§ 371 (c)(1),
(2), (4) Date: Dec. 4, 2013

(87) PCT Pub. No.: WO2012/117372
PCT Pub. Date: Sep. 7, 2012

(65) Prior Publication Data
US 2014/0302633 A1  Oct. 9, 2014

(30) Foreign Application Priority Data
Mar. 2, 2011 (FR) .................................. 11 00624

(51) Int. Cl.
*H01L 21/00* (2006.01)
*H01L 31/18* (2006.01)
*C09K 13/06* (2006.01)
(Continued)

(52) U.S. Cl.
CPC ................ *H01L 31/18* (2013.01); *C09K 13/06* (2013.01); *H01L 31/0322* (2013.01); *Y02E 10/541* (2013.01); *H01L 31/0463* (2014.12)

(58) Field of Classification Search
CPC .... H01L 31/208; H01L 31/1888; H01L 31/18
USPC .......................................................... 438/95
See application file for complete search history.

(56) References Cited

U.S. PATENT DOCUMENTS

2006/0038182 A1* 2/2006 Rogers et al. ................... 257/77
2007/0295381 A1* 12/2007 Fujii et al. ..................... 136/244
(Continued)

FOREIGN PATENT DOCUMENTS

WO    2010/058283    5/2010

OTHER PUBLICATIONS

Canava et al., Increasing Solar Cell Efficiencies Based on Cu(In,Ga)Se2 after a Specific Chemical and Oxidant Treatment, Phys. Stat. Sol., 3, pp. 2551-2554, 2006.
(Continued)

*Primary Examiner* — Caleb Henry
(74) *Attorney, Agent, or Firm* — Morgan, Lewis & Bockius LLP

(57) ABSTRACT

The present invention relates to a process for selective wet chemical etching of a thin-film substrate comprising a CIGS surface layer. The present invention also relates to a process for producing cells in series for thin-film photovoltaic modules, which process implements the selective wet chemical etching process according to the invention. The present invention furthermore relates to a process for creating small patterns, such as for example monolithic interconnects, in thin-film photovoltaic devices, which process implements the selective wet chemical etching process according to the invention.

13 Claims, 1 Drawing Sheet

Figure 1:
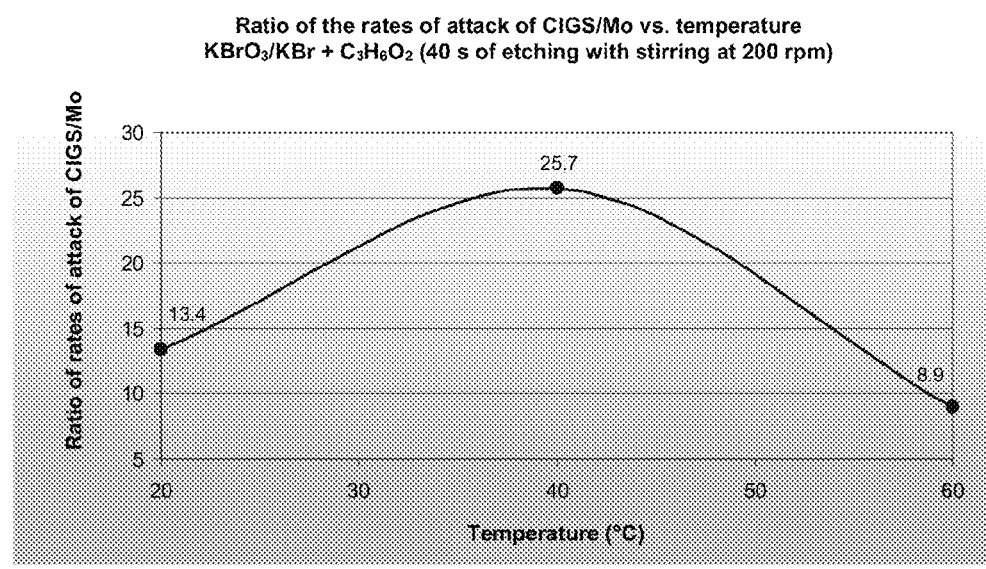

(51) Int. Cl.
*H01L 31/032* (2006.01)
*H01L 31/0463* (2014.01)

(56) References Cited

U.S. PATENT DOCUMENTS

2011/0259420 A1* 10/2011 Yamazaki et al. ............ 136/259
2012/0025191 A1* 2/2012 Yamazaki ...................... 257/57
2012/0060925 A1* 3/2012 Kim .............................. 136/261
2012/0115312 A1* 5/2012 Agrawal et al. ............. 438/478
2012/0292758 A1* 11/2012 Ono .............................. 257/734
2013/0081683 A1* 4/2013 Masunaga et al. ........... 136/255
2013/0164885 A1* 6/2013 Liang et al. .................... 438/95
2014/0322861 A1* 10/2014 Tsuda et al. .................... 438/98

OTHER PUBLICATIONS

Bouttemy et al., Thinning of CIGS Solar Cells: Part I: Chemical Processing Acidic Bromine Solutions, Thin Solid Films, 519, pp. 7207-7211, 2011.

* cited by examiner

SELECTIVE CHEMICAL ETCHING PROCESS

The present invention relates to a process for the selective wet chemical etching of a thin-film substrate comprising a CIGS surface layer.

The present invention also relates to a process for producing cells in series in thin-film photovoltaic modules, using the selective wet chemical etching process according to the invention.

The present invention additionally relates to a process for creating patterns of reduced dimensions, such as for example monolithic interconnections, on thin-film photovoltaic devices, using the selective wet chemical etching process according to the invention.

The field of the photovoltaic conversion of solar energy has, for several years, experienced spectacular development. Thin-film materials comprising a 1 to 5 μm layer of Cu—In—Ga—S or Cu—In—Ga—Se (CIGS) alloy are particularly efficient materials for carrying out photovoltaic conversion and, consequently, are used in the manufacture of thin-film photovoltaic panels. In order to be able to adjust the electric conversion efficiency and provide the potential difference envisaged by the specifications, the photovoltaic module must be equipped with a suitable number of cells in series.

One process that is commonly used for the formation of cells at the surface of a thin-film photovoltaic module is mechanical etching (W. N. Shafarman and L. Stolt, Handbook of Photovoltaic Science and Engineering, Chapter 13, pages 604-605) which consists in hollowing out grooves along a given path with cutters of variable sizes and geometries. This type of process has drawbacks. Specifically, the mechanical etching is not selective: the etching may equally attack the various constituent layers of the module and/or damage the surface of said module, thus reducing its electrical characteristics. Besides the surface to be etched, the mechanical etching may cause losses of usable surface at the CIGS layer. Furthermore, the degree of etching by this type of process is not always sufficient, which lengthens the etching process, and therefore increases the chances of destroying the other layers and/or of damaging the surface of the module.

Another technique used for the formation of cells at the surface of a thin-film photovoltaic module is wet chemical etching, which consists in submerging the substrate in a solution which will chemically attack the surface to be etched. This technique has several advantages. It is relatively easy to implement and therefore advantageous from an industrial viewpoint. The degree of etching by this technique is particularly high, which makes the etching rapid.

Thus:
- R. W. Birkmire and B. E. McCandless, (Appl. Phys. Lett., 1988, 53 (2), pages 140-141) described a chemical etching process for the purpose of obtaining specular CIS surfaces. This quality of the surface of the CIS is desired in order to improve the electrical characteristics of tandem α-Si:CuInSe$_2$ cells. The etching solution is an aqueous solution of bromine (Br$_2$) with concentrations ranging from 0.02 mol/l to 0.25 mol/l. The rates of attack observed (after etchings at ambient temperature) ranged from 0.1 to 5.5 μm/min.
- Canava et al. (Journal of Physics and Chemistry of Solids, 2003, 64, pages 1791-1796) also described a wet chemical etching process for the purpose of obtaining specular CIGS surfaces and controlling the composition of the thin films, in particular the composition of the CIGS layer. In this process, a glass substrate comprising a molybdenum layer and a CIGS layer partially protected by resin is submerged in a 0.001-1 mol/l solution of Br$_2$ in water, at ambient temperature, and for a few seconds, then treated with a solution of 0.1 mol/l of KCN at 70° C. The analysis of the CIGS layer shows a reduction in the thickness of this layer after etching, and a variation in the composition of the CIGS layer (layer richer or poorer in Se).

The objective in these documents is not to remove, in places, all of the CIGS layer, but to obtain specular CIGS surfaces, i.e. that have a mirror finish.

The major drawbacks of these chemical etching processes are:
- a significant release of toxic Br$_2$ vapors, and/or
- the non-selectivity of the etching of the CIGS layer with respect to the molybdenum layer.

Patent application US 2007/0227578 describes a process for the chemical etching of a thin-film photovoltaic module comprising a CIGS surface layer, in which the etching of the CIGS layer takes place selectively with respect to the photosensitive resin layer and to the underlying metal layer. The etching solution used is a mixture of $H_2SO_4$ and $H_2O_2$. One of the drawbacks of this method is the use of the mixture of $H_2SO_4$ and $H_2O_2$, which is a reactive and dangerous mixture, and therefore difficult to use in industry. Furthermore, despite the assertions of the authors, experimentation shows that the process for the chemical etching of the CIGS layer in US 2007/0227578, is not selective. Indeed if all of the CIGS layer is etched in accordance with the process described in US 2007/0227578, the underlying metal layer will be too.

There is therefore a real need for a process for the selective etching, in particular selective wet chemical etching, of a thin-film substrate comprising a CIGS surface layer that overcomes the drawbacks of the prior art.

In particular, there is a real need for a selective wet chemical etching process that makes it possible to etch the CIGS surface layer of a thin-film substrate and that also comprises an underlying metal layer comprising molybdenum, without said underlying metal layer being attacked.

More particularly, there is a real need for a selective wet chemical etching process that avoids resorting to toxic, polluting and/or dangerous chemical reactants and that avoids the losses of usable surface at the CIGS layer.

The objective of the present invention is specifically to meet these needs by providing a process for the selective wet chemical etching of a thin-film substrate comprising at least one CIGS surface layer to be etched, and an underlying metal layer comprising molybdenum deposited on a support, characterized in that it comprises the following steps:

a) submerging the substrate to be etched in a solution comprising:
 - at least one precursor of Br$_2$ or Cl$_2$,
 - at least one organic monoacid, and
 - at least one compound of formula MX wherein
   - M represents an alkali metal chosen from sodium and potassium;
   - X represents a halogen atom chosen from chlorine and bromine;

b) subjecting the substrate submerged in the solution used in step a), to a heat treatment that enables the selective reaction of Br$_2$ or Cl$_2$ with the aforementioned surface layer.

The Br$_2$ or Cl$_2$ molecules are suitable for reacting with the CIGS surface layer and for not reacting with the underlying metal layer comprising molybdenum.

Thus, the process of the invention has the advantage of etching the CIGS surface layer in a precise and controlled manner, while reducing as far as possible the losses of usable surface at this layer.

It is also possible to control, with great accuracy, the quality of the surface layer and its final surface state after etching.

Within the context of the present invention, the term "solution" is understood to mean a homogenous or heterogeneous mixture of two or more compounds in a solvent or a mixture of solvents. The term "solution" thus encompasses solutions, saturated solutions, suspensions and/or dispersions. Preferably, the solution is a homogenous mixture of two or more compounds in a solvent or a mixture of solvents.

Within the meaning of the invention, the term "etching" is understood to mean the operation that consists in removing, everywhere where it is not desired, the whole of the CIGS surface layer, in a thin-film substrate comprising, besides said CIGS surface layer, an underlying metal layer comprising molybdenum, which metal layer is deposited on a support.

Within the context of the invention, the thin-film substrate is a substrate which comprises a support coated with a first metal layer comprising molybdenum, itself coated with a CIGS layer. Said thin-film substrate may be, for example, a module of a photovoltaic device.

The term "CIGS" is used in the broad sense and means an alloy of copper, indium, gallium and selenium or sulfur corresponding to the chemical formula $CuIn_yGa_{(1-y)}Q_2$, in which the value of y may vary from 1 to 0 and Q may be a sulfur or selenium atom. Variants of CIGS in which the gallium is absent and/or the selenium is replaced by sulfur are also covered by this term. All the CIGS materials from the prior art may be suitable for the present invention. In this respect, mention may be made, for example, of the CIGS materials described in Y. Hamakawa, "Thin-Film Solar Cells", chapter 10, (2004).

In the invention, the thickness of the CIGS layer, before etching, is typically between 1 and 5 μm, limits included.

As already indicated, in the invention the etching of the CIGS layer by the process of the invention results in a total elimination of the CIGS layer in the desired zones.

Thus, with the process of the invention, the CIGS zones removed typically have a size (larger dimension out of height and width) of the order of the thickness of the initial CIGS layer.

The support may be chosen from glass, stainless steel and plastic such as Kapton®, aramids that are resistant to 400° C., Kermel® fibers that are resistant to 1000° C. The support is more particularly glass, and more particularly still soda-lime glass.

According to one advantageous embodiment of the process of the invention, the solution used in step a) comprises:

at least one precursor of $Br_2$ or $Cl_2$ of formula (I):

$$MXO_x \qquad (I)$$

wherein M and X have the same definitions as for the compound MX, and x is an integer between 1 and 3, limits included; and at least one polar solvent.

As indicated, besides the precursor of $Br_2$ and $Cl_2$ and the polar solvents, the etching solution used in step a) comprises at least one organic monoacid.

The solution of the invention makes it possible to generate, in situ, $Br_2$ or $Cl_2$ according to the following reaction:

$$MOX_3 + \text{organic monoacid} \rightarrow XO_3^- + 5X^- + 6H^+ \rightarrow 3X_2 + 3H_2O$$

with passage through the intermediate MXO and optionally $MXO_2$.

Thus, the precursor of $Br_2$ or $Cl_2$ may just as well have the formula $MOX_3$ as the formula MXO or as the formula $MXO_2$, when the latter exist in a stable manner in the polar solvent, in particular in water.

This in situ generation of $Br_2$ or $Cl_2$ limits the release of $Br_2$ and $Cl_2$, compared to the case where a solution is used that contains already formed $Br_2$ or $Cl_2$.

The expression "organic monoacid" is understood to mean a compound of formula RCOOH in which R may be a $C_1$ to $C_{12}$ alkyl group or a $C_6$ to $C_{20}$ aryl group.

The term "alkyl" is understood, within the meaning of the present invention, to mean an optionally substituted, saturated or unsaturated, linear, branched or cyclic carbon radical comprising 1 to 12 carbon atoms. By way of indication, mention may be made of the methyl, ethyl, propyl, butyl, isobutyl, pentyl, hexyl, octyl, nonyl, decyl, undecyl and dodecanyl radicals, and the branched isomers thereof. As a cyclic alkyl, mention may also be made of the cyclopropyl, cyclobutyl, cyclopentyl, cyclohexyl, bicyclo[2.1.1]hexyl and bicyclo[2.2.1]heptyl radicals. The alkyl group may optionally be substituted with one or more hydroxyl groups, with one or more halogen atoms chosen from fluorine, chlorine, bromine and iodine.

The term "aryl" generally denotes a cyclic aromatic substituent comprising from 6 to 20 carbon atoms. Within the context of the invention, the aryl group may be monocyclic or polycyclic. By way of indication, mention may be made of phenyl and naphthyl. The aryl group may optionally be substituted with one or more hydroxyl groups, with one or more halogen atoms chosen from fluorine, chlorine, bromine and iodine.

The choice of the organic monoacid(s) in step a) is important, or even decisive. Thus, by its acidity ($pK_a$), the organic monoacid must be capable of reacting with the precursor of $Br_2$ or $Cl_2$ in order to release $Br_2$ or $Cl_2$ which will attack the CIGS surface layer of the thin-film substrate. By its spatial form or its steric hindrance, the organic monoacid must prevent the $Br_2$ or $Cl_2$ from accessing the metal layer or at the very least slow down its arrival at said metal layer.

It is therefore important for the organic monoacid to be:

sufficiently strong ($pK_a$) to ensure the generation of $Br_2$ or $Cl_2$, starting from the precursor thereof;

sufficiently hindered, i.e. having a molecular weight of at least 60 g/mol, to enable it to passivate and protect the underlying layer comprising molybdenum or entirely consisting of molybdenum. Without wishing to be bound by the theory, this is because, when an organic acid reacts with a layer of oxophilic metal such as molybdenum, it immediately forms a carboxylate. This carboxylate is in equilibrium with the free form of the acid in the solution. If the acid is "small", this exchange is very rapid and the metal could be attacked. On the other hand, if the acid is sufficiently "bulky", this exchange is greatly slowed down and the metal is thus protected;

sufficiently soluble, i.e. a solubility of at least 20 g/l, to prevent the formation of an emulsion when the monoacids have high molecular weights, typically of the order of 200 g/mol.

Preferably, the organic monoacids satisfy the following conditions:

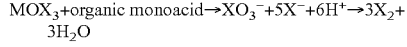

a $pK_a$ of less than 5, in particular $0.5 \leq pK_a \leq 5$, more particularly $0.7 \leq pK_a \leq 4.9$;

a molecular weight (MW) of at least 60 g/mol, in particular 60 g/mol ≤ molecular weight (MW) ≤ 200 g/mol, more particularly 70 g/mol ≤ MW ≤ 125 g/mol;

a solubility of at least 20 g/l, in particular 20 g/l ≤ solubility ≤ 1000 g/l.

Within the context of the present invention, the solubility of a compound is understood to mean the maximum amount (in grams per liter) of this compound that can be dissolved or disassociated in 1 liter of water at 20° C.

The $pK_a$ defines the strength of an acid. The $pK_a$ values indicated above were determined at 20° C.

The organic monoacids according to invention are preferably chosen from acetic acid, bromo-, chloro-, dichloro-, trichloro- or trifluoroacetic acid; propionic acid; butyric acid; α-, β- or χ-chlorobutyric acid; valeric acid; 2-, 4- or 5-bromovaleric acid; lactic acid; salicylic acid; acetylsalicylic acid; and mixtures of at least two thereof. Preferably, the organic monoacid is propionic acid.

The monoacid according to invention may, where appropriate, be used as a mixture with a mineral acid, such as for example hydrochloric acid.

The concentration of organic monoacid(s) in the solution is advantageously between 0.1M and 5M, preferably between 0.5M and 2M, limits included.

Within the meaning of the invention, the expression "polar solvent" is understood to mean a solvent having a dipole moment that may or may not possess one or more hydrogen atoms capable of forming hydrogen bonds. In this regard, mention may be made, for example, of water, methanol, ethanol, acetonitrile ($CH_3CN$), dimethyl sulfoxide (DMSO, $(CH_3)_2SO$), and tetrahydrofuran (THF, $C_4H_8O$), etc.

In the solution used in step a), the polar solvent is more particularly chosen from water, methanol, ethanol, propanol, isopropanol, n-butanol, ethyl ether, THF, DMF, DMSO, and mixtures of at least two thereof. Preferably, in the solution used in step a), the solvent contains at least 80% by weight of water. More preferably still, the solvent is water.

The molar ratio between the precursor(s) of $Br_2$ or $Cl_2$ and the organic monoacid(s) in the solution in step a) is between 0.02 and 1, preferably between 0.05 and 0.2, limits included.

Still in step a), the solution also comprises at least one compound of formula MX in which M and X are as defined previously. This compound may improve the dissolution of $Br_2$ or $Cl_2$, and/or the stability of the etching solution.

According to one preferred embodiment of the invention, the solution from step a) is a solution comprising $KBrO_3$ or KBrO, KBr and propionic acid in water.

The substrate, the CIGS surface layer of which is to be etched, is submerged in the etching solution. This submersion is carried out so that the substrate is completely submerged in the etching solution.

The substrate submerged in said solution is then subjected to a heat treatment during which the $Br_2$ or $Cl_2$ generated reacts selectively with the aforementioned surface layer.

More particularly, the heat treatment in step b) is carried out at a temperature between 25° C. and 80° C., preferably between 25° C. and 60° C., limits included.

The duration of the heat treatment may be between 1 second and 15 minutes, preferably between 30 seconds and 5 minutes, limits included.

It is specifically this heat treatment that enables the selective etching by $Br_2$ or $Cl_2$ generated in situ. The $Br_2$ or $Cl_2$ thus generated will then attack the CIGS surface layer without attacking the underlying metal layer.

Depending on the nature of the precursor used in step a), $Br_2$ or $Cl_2$ is generated. Preferably, $Br_2$ is generated.

Generally, the concentration of $Br_2$ or $Cl_2$ in solution is between 0.001 and 1 mol/l, limits included.

In step b), in order to homogenize the solution and thus obtain a more uniform etching, the solution may be stirred, for example using a magnetic stirrer. A person skilled in the art will know how to choose the suitable stirring speed as a function of the volume to be treated and the temperature.

With the process of the invention, the etching rate of the CIGS surface layer is at least 25 times faster than the etching rate of the underlying metal layer comprising molybdenum. Hence, it is possible to control the etching of the surface layer so that at the end of step b) the underlying metal layer remains intact.

According to another embodiment of the process of the invention, the substrate and more particularly the CIGS surface layer is partially protected with a photolithographic resin according to known processes.

Another subject of the invention is a process for producing cells in series in a thin-film photovoltaic module comprising at least one CIGS surface layer, and an underlying metal layer comprising molybdenum deposited on a support, characterized in that cells are produced in series in said module by using the selective wet chemical etching process according to the invention.

An additional subject of the invention is a process for creating patterns of reduced dimensions, such as monolithic interconnections, on thin-film photovoltaic devices comprising at least one CIGS surface layer, and an underlying metal layer comprising molybdenum deposited on a support, characterized in that patterns of reduced dimensions, such as for example monolithic interconnections, are produced on said thin-film photovoltaic device using the selective wet chemical etching process according to the invention. The dimensions of the patterns thus created are of the order of the thickness of the CIGS layer.

Figure 2:
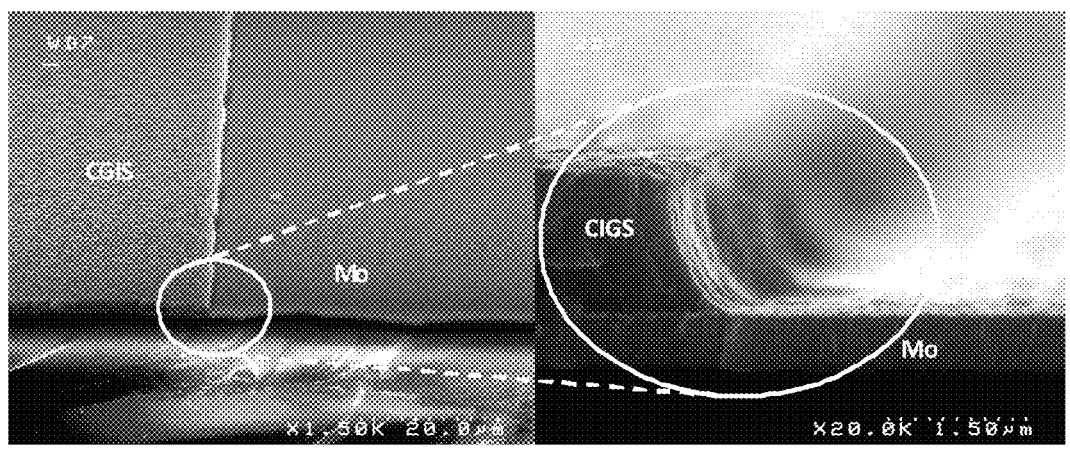

Other advantages and features of the present invention will also become apparent on reading the examples below given by way of illustration and the appended figures:

FIG. 1 represents the ratio of the rates of attack of CIGS/Mo type layers as a function of the temperature. The ratios of the rate of attack were determined after 40 seconds of etching at 20° C., 40° C. and 60° C., with an etching solution comprising $KBrO_3$/KBr and propionic acid, with stirring at 200 rpm;

FIG. 2 represents photographs taken with a scanning electron microscope of an etched groove on a substrate comprising a soda-lime glass support coated with a layer of molybdenum, itself coated with a CIGS layer. This etching was carried out according to example 2, with a brominated solution containing propionic acid (etching for 180 seconds at 40° C., with stirring at 200 rpm.). The right-hand image, which is an enlargement of a detail from the left-hand image, shows that the CIGS layer has indeed been etched down to the molybdenum layer but without the underlying molybdenum layer being attacked by the etching solution.

EXAMPLES

Example 1

The etching solution comprises 400 ml of a 0.9M solution of propionic acid in $KBrO_3$/KBr (Bromide bromate Standard Solution, ready-to-use 0.25M Br—(0.5N), sold by the company Fluka under the reference 35007).

A sample (1) consisting of a soda-lime glass support covered with a layer of molybdenum deposited by PVD, which is itself covered with a 1.5 μm layer of CIGS deposited by vacuum co-evaporation, and a sample (2) consisting of a soda-lime glass support covered only with a 0.5 μm layer of molybdenum deposited by PVD, are submerged in the etching solution.

The mixture is then brought to a temperature of 60° C. inside a double-wall beaker which is in turn temperature-controlled by a Polystat. In order to homogenize the mixture and thus obtained a more uniform etching, the solution is stirred with a magnetic stirrer at 200 rpm.

The ratios of the rates of attack of the CIGS and Mo (CIGS/Mo) layers were analyzed at temperatures of 20° C., 40° C. and 60° C., and for a duration set at 40 seconds (see FIG. 1).

FIG. 1 shows that the rate of etching is maximal after a heat treatment at 40° C. for 40 seconds, and that under these conditions, the sample (1) that consists of a a soda-lime glass support covered with a layer of molybdenum, which is itself covered with a 1.5 μm layer of CIGS, is etched 25.7 times faster than the sample (2) which consists of a soda-lime glass support covered with a 0.5 μm layer of molybdenum only.

Example 2

A sample consisting of a soda-lime glass support covered with a layer of molybdenum, which is itself covered with a 1.5 μm layer of CIGS, prepared according to the procedure indicated in example 1, is partially protected with the photolithographic resin. The sample is then submerged in 400 ml of a 0.9M solution of propionic acid in $KBrO_3/KBr$ (Bromide bromate Standard Solution, ready-to-use 0.25M Br—(0.5N), sold by the company Fluka under the reference 35007).

The mixture is then brought to a temperature of 40° C. for 180 seconds inside a double-wall beaker which is in turn temperature-controlled by a Polystat. In order to homogenize the mixture and thus obtain a more uniform etching, the solution is stirred with a magnetic stirrer at 200 rpm.

The result of this etching can be seen in FIG. 2.

The right-hand image, which is an enlargement of a detail from the left-hand image, shows that the CIGS layer has indeed been etched but that neither the underlying molybdenum layer nor the photolithographic resin is attacked by the etching solution.

The invention claimed is:

1. A process for the selective wet chemical etching of a thin-film substrate comprising at least one CIGS surface layer to be etched, and an underlying metal layer comprising molybdenum deposited on a support, characterized in that it comprises the following steps:
    a) submerging the substrate to be etched in a solution comprising:
        at least one precursor of $Br_2$ or $Cl_2$,
        at least one organic monoacid, and
        at least one compound of formula MX wherein
            M represents an alkali metal chosen from sodium and potassium;
            X represents a halogen atom chosen from chlorine and bromine;
    b) subjecting the substrate submerged in the solution used in step a), to a heat treatment that enables the selective reaction of $Br_2$ or $Cl_2$ with the aforementioned surface layer.

2. The process as claimed in claim 1, characterized in that the solution used in step a) comprises:
    at least one precursor of $Br_2$ or $Cl_2$ of formula (I):

$$MXO_x \quad (I)$$

wherein M and X have the same definitions as in claim 1 and x is an integer between 1 and 3, limits included; and
    at least one polar solvent.

3. The process as claimed in claim 1, characterized in that the organic monoacid satisfies the following conditions:
    $0.5 \leq pK_a < 5$;
    60 g/mol ≤ molecular weight ≤ 200 g/mol;
    20 g/l ≤ solubility ≤ 1000 g/l.

4. The process as claimed in claim 1, characterized in that the organic monoacid is chosen from acetic acid, bromo-, chloro-, dichloro-, trichloro- or trifluoroacetic acid; propionic acid; butyric acid; α-, β- or χ-chlorobutyric acid; valeric acid; 2-, 4- or 5-bromovaleric acid; lactic acid; salicylic acid; acetylsalicylic acid; and mixtures of at least two thereof.

5. The process as claimed in claim 1, characterized in that, in the solution used in step a), the polar solvent is chosen from water, methanol, ethanol, propanol, isopropanol, n-butanol, ethyl ether, THF, DMF, DMSO, and mixtures of at least two thereof.

6. The process as claimed in claim 1, characterized in that the concentration of organic monoacid(s) in the solution is between 0.1M and 5M, limits included.

7. The process as claimed in claim 1, characterized in that, in the solution in step a), the molar ratio between the precursor(s) of $Br_2$ or $Cl_2$ and the organic monoacid(s) is between 0.02 and 1, limits included.

8. The process as claimed in claim 1, characterized in that the solution from step a) comprises $KBrO_3$ or KBrO, KBr and propionic acid in water.

9. The process as claimed in claim 1, characterized in that the heat treatment in step b) is carried out at a temperature between 25° C. and 80° C., limits included.

10. The process as claimed in claim 1, characterized in that the heat treatment in step b) is carried out over a duration between 1 second and 15 minutes, limits included.

11. The process as claimed in claim 1, characterized in that the concentration of $Br_2$ or $Cl_2$ generated in solution is between 0.001 and 1 mol/l, limits included.

12. A process for producing cells in series in a thin-film photovoltaic module comprising at least one CIGS surface layer, and an underlying metal layer comprising molybdenum deposited on a support, characterized in that cells are produced in series in said module by using the selective wet chemical etching process as claimed in claim 1.

13. A process for creating patterns of reduced dimensions on thin-film photovoltaic devices comprising at least one CIGS surface layer, and an underlying metal layer comprising molybdenum deposited on a support, characterized in that patterns of reduced dimensions are produced on said thin-film photovoltaic device using the selective wet chemical etching process as claimed in claim 1.

* * * * *